(12) United States Patent
Yang et al.

(10) Patent No.: US 9,281,184 B2
(45) Date of Patent: Mar. 8, 2016

(54) FABRICATION METHOD OF NITRIDE FORMING ON SILICON SUBSTRATE

(75) Inventors: Chih-Chung Yang, Taipei (TW); Chih-Yen Chen, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 523 days.

(21) Appl. No.: 13/442,885

(22) Filed: Apr. 10, 2012

(65) Prior Publication Data

US 2013/0217212 A1     Aug. 22, 2013

(30) Foreign Application Priority Data

Feb. 16, 2012 (TW) .............................. 101105082 A

(51) Int. Cl.
*H01L 21/20* (2006.01)
*H01L 21/02* (2006.01)

(52) U.S. Cl.
CPC ...... *H01L 21/02381* (2013.01); *H01L 21/0254* (2013.01); *H01L 21/02458* (2013.01); *H01L 21/02507* (2013.01)

(58) Field of Classification Search
CPC ....................................................... H01L 21/20
USPC ........................................................ 438/478
See application file for complete search history.

(56) References Cited

U.S. PATENT DOCUMENTS

2001/0035531 A1* 11/2001 Kano et al. ...................... 257/96

2006/0273325 A1* 12/2006 Surya .................. H01L 31/0304
                                                                257/79
2008/0142781 A1*  6/2008 Lee ................................. 257/13
2010/0288999 A1* 11/2010 Kikuchi et al. ................. 257/13

FOREIGN PATENT DOCUMENTS

TW      200929758      7/2009
TW      201133936     10/2011

OTHER PUBLICATIONS

Huang et al., "GaN grown on Si(1 1 1) with step-graded AlGaN intermediate layers", Applied Surface Science, Apr. 14 2010, vol. 256, p. 6367-p. 6370.
Raghaven et al, "Growth stresses and cracking in GaN films on (111) Si grown by metalorganic chemical vapor deposition. II. Graded AlGaN buffer layers", Journal of Applied Physics, 2005, vol. 98, p. 023515-1-p. 023515-8.
Lee et al., "Growth of high-quality InGaN/GaN LED structures on (111) Si substrates with internal quantum efficiency exceeding 50%", Journal of Crystal Growth, 2011, vol. 315, p. 263-p. 266.
"Office Action of Taiwan Counterpart Application", issued on Dec. 23, 2013, p. 1-p. 4.

* cited by examiner

*Primary Examiner* — Kenneth Parker
*Assistant Examiner* — Christopher Culbert
(74) *Attorney, Agent, or Firm* — Jianq Chyun IP Office

(57) ABSTRACT

The invention is directed to a method for forming a nitride on a silicon substrate. In the method of the present invention, a silicon substrate is provided and a buffer layer is formed on the silicon substrate. The formation of the buffer layer includes a multi-level temperature modulation process having a plurality temperature levels and a plurality of temperature modulations. For each of the temperature modulations, the temperature is gradually decreased. A nitride is formed on the buffer layer.

9 Claims, 3 Drawing Sheets

US 9,281,184 B2

FABRICATION METHOD OF NITRIDE FORMING ON SILICON SUBSTRATE

CROSS-REFERENCE TO RELATED APPLICATION

This application claims the priority benefit of Taiwan application serial no. 101105082, filed on Feb. 16, 2012. The entirety of the above-mentioned patent application is hereby incorporated by reference herein and made a part of this specification.

BACKGROUND OF THE INVENTION

1. Field of Invention

The present invention relates to a method for forming a nitride. More particularly, the present invention relates to a method for forming a nitride on a silicon substrate.

2. Description of Related Art

The silicon substrate has the properties including low price, large wafer size and high thermal and electrical conductivities and the potential for integrating with electrical circuit so that the silicon substrates attract a lot of attentions and are widely used in the epitaxy technology. For instance, the silicon substrate is used as the substrate for the growth of the nitride semiconductor device.

However, the thermal expansion coefficient of the silicon substrate is different from that of the film made by the epitaxy (taking the nitride-containing semiconductor device as an example). Thus, a tensile stress is generated within the nitride during the temperature dropping process after the nitride is formed and the tensile stress pulls and drags the lattice structure of the nitride so as to form cracks in the nitride. Therefore, how to form a crack-free epitaxy structure on the silicon substrate becomes one of the important issues to one ordinary skilled in the art.

Currently, in the conventional technology, trenches are formed on the silicon substrate to release the stress in the nitride. However, the aforementioned method limits the variations of the device layout. Moreover, another conventional technology uses a buffer layer structure formed between the nitride and the silicon substrate to decrease the negative effect from the thermal stress. For instance, in the formation of the ternary aluminum gallium nitride buffer layer, by step-by-step modulating the ratio of aluminum to gallium, a compressive stress is generated to compensate the tensile stress generated within the nitride during the temperature dropping process after the nitride is formed so as to decrease the negative effect from the thermal stress and further to obtain the crack-free quality of the epitaxy. However, steps of the aforementioned method are complex.

SUMMARY OF THE INVENTION

The present invention is to provide a method for forming a nitride with a crack-free structure on the silicon substrate.

The invention provides a method for forming a nitride on the silicon substrate. In the method, a silicon substrate is provided and a buffer layer is formed on the silicon substrate. The formation of the buffer layer includes a multi-level temperature modulation process having a plurality temperature levels and a plurality of temperature modulations. For each of the temperature modulations, the temperature is step-by-step decreased. A nitride is formed on the buffer layer.

According to one embodiment of the present invention, each of the temperature levels is in the range of 600~200 centigrade.

According to one embodiment of the present invention, the total thickness of the buffer layer is 100~1000 nm.

According to one embodiment of the present invention, the buffer layer is made of aluminum nitride.

According to one embodiment of the present invention, the step of forming the nitride comprises forming a first portion of the nitride and forming a second portion of the nitride on the first portion of the nitride and the step of forming the nitride on the silicon substrate further comprises forming an insertion layer on the first portion of the nitride after the first portion of the nitride is formed and before the second portion of the nitride is formed.

According to one embodiment of the present invention, the insertion layer comprises at least a superlattice layer structure.

According to one embodiment of the present invention, the superlattice layer structure comprises an aluminum nitride layer and a gallium nitride layer.

Accordingly, in the embodiment of the present invention, the method for forming the nitride on the silicon substrate utilizes the buffer layer formed by the multi-level temperature modulation process to prevent the quality of the later formed epitaxy from being affected by the thermal stress. Specifically, for instance, during the formation of the buffer layer, the multi-level temperature modulation process in which the temperature is progressively dropped is implemented so that the buffer layer formed during the multi-level temperature modulation process provides compressive stress to compensate the tensile stress generated within the nitride during the temperature dropping process after the nitride is formed. Thus, the crack-free nitride structure can be produced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
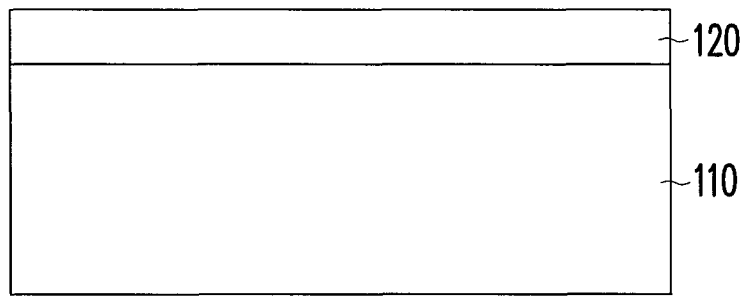
FIG. 1A and FIG. 1B are schematic cross-sectional diagrams showing a method for forming a nitride on a silicon substrate according to one embodiment of the present invention.
Figure 1B:
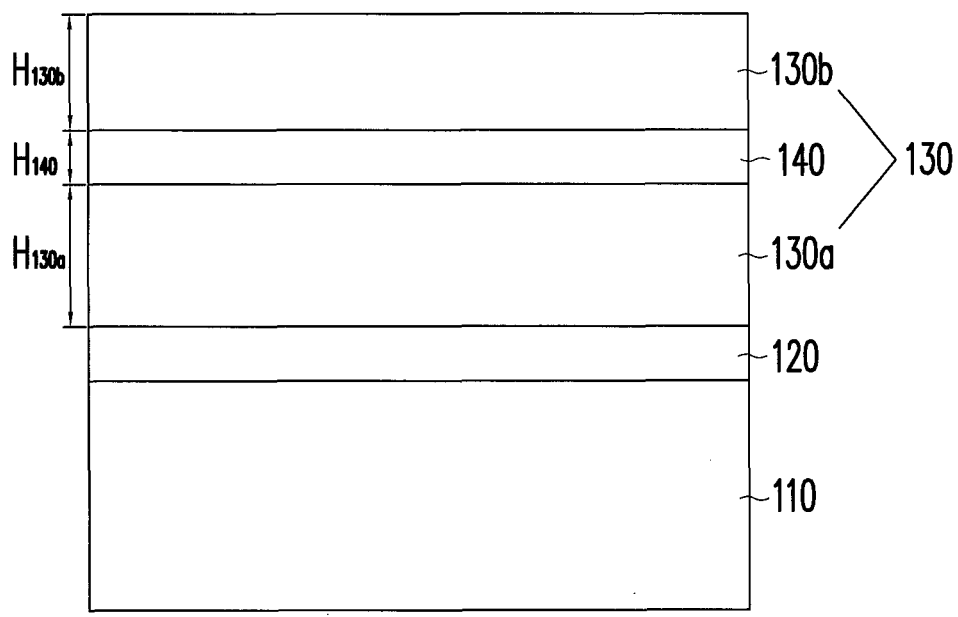

FIG. 1A and FIG. 1B are schematic cross-sectional diagrams showing a method for forming a nitride on a silicon substrate according to one embodiment of the present invention.

As shown in FIG. 1A, a silicon substrate 110 is provided. A buffer layer 120 is formed on the silicon substrate 110. The buffer layer 120 can be made of, for example, metal nitride material. In the present embodiment, the material of the buffer layer 120 includes aluminum nitride. Moreover, the method for forming the buffer layer can be, for example, the metal organic chemical vapor deposition (MOCVD). However, the present embodiment is not limited to the method mentioned herein.

Further, the formation of the buffer layer 120 comprises a multi-level temperature modulation process with many temperature levels and many temperature modulations, wherein each of the temperature levels is between 600~1200 centigrade and each temperature modulation of the multi-level temperature modulation process comprises progressively decreasing the temperature. Specifically, the temperature modulation can be the temperature progressively decreasing from 1000 centigrade and the unit of the range of each temperature modulation can be 50 centigrade or 100 centigrade. However, the present embodiment is not limited to the way to modulate the temperature mentioned above. Practically, the number of the temperature levels in the multi-level temperature modulation process and the range of each temperature modulation can be adjusted according to the requirement.

More specifically, in the multi-level temperature modulation process for forming the buffer layer 120, the curve of the process temperature modulated with the time is much like a downward stairway curve. For instance, during the formation of the buffer layer 120 of the present invention and in the multi-level temperature modulation process, the process temperature ramps down from one temperature level to another in each temperature modulation and the process temperature at each temperature level remains unchanged until the thickness increasing amount of the buffer layer 120 at this temperature level reaches a specific or predetermined thickness. The aforementioned thickness increasing amount of the buffer layer at each temperature level can be, for example, 0~100 nanometers. Preferably, the thickness increasing amount of the buffer layer at each temperature level can be, for example, 35 nanometers or 50 nanometers.

Comparing to the current technology in which the buffer layer is formed by modulating ternary element components, the buffer layer 120 of the present embodiment is formed from binary element components (the binary element components are directed to the nitrogen and aluminum) by the multi-level temperature modulation process. Hence, the method for forming the buffer layer 120 of the present embodiment is simple and the thickness of the buffer layer 120 is smaller than 1 micron. In the present embodiment, the thickness of the buffer layer 120 is, for example, about 100 nm~1000 nm.

As shown in FIG. 1B, a nitride 130 is formed on the buffer layer 120. In the present embodiment, the nitride 130 can be made of, for example, gallium nitride. It should be noticed that, since the thermal expansion coefficient of the silicon substrate 110 (which is about $2.59 \times 10^{-6} K^{-1}$) is smaller than the thermal expansion coefficient of the gallium nitride (which is about $5.59 \times 10^{-6} K^{-1}$), the shrinking amount of the gallium nitride is larger than that of the silicon substrate 110 during the temperature dropping process after the gallium nitride film is formed. Therefore, a tensile stress within the gallium nitride is generated under the effect of the silicon substrate to pull and drag the lattice structure of the gallium nitride, which easily leads to the cracks of the gallium nitride. Thus, in the present embodiment, before the gallium nitride structure is formed, a multi-level temperature modulation process with progressively decreasing the temperature is performed to form the buffer layer 120 on the silicon substrate 110, wherein the buffer layer is capable of providing the compressive stress to compensate the thermally induced tensile stress. Accordingly, the negative effect due to the thermal stress (which is the tensile stress herein) during the temperature dropping process after the gallium nitride film is formed can be alleviated.

Moreover, in the present invention, an insertion layer 140 can be optionally formed to further provide the compressive stress. The structure of the insertion layer 140 can be the superlattice structure. Specifically, the insertion layer 140 can comprise, for example, at least one layer of the superlattice structure layer, wherein the superlattice structure layer comprises an aluminum nitride layer and a gallium nitride layer. In the present embodiment, the insertion layer 140 can be, for example, a three-layer superlattice structure layer with a thickness $H_{140}$ of about 200 nanometer.

In the present embodiment, the method for forming the insertion layer 140 comprises steps of forming a first portion 130a of the nitride 130 on the buffer layer 120 and then forming the insertion layer 140 on a side of the first portion 130a of the nitride 130 away from the buffer layer 120. Thereafter, a second portion 130b of the nitride 130 is formed on a side of the insertion layer 140 away from the first portion 130a of the nitride 130. In other words, the insertion layer 140 is located within the nitride 130. Therefore, the influence of the compressive stress provided by the insertion layer 140 for compensating for the tensile stress does not decrease a bit while the nitride 130 is over thick. In the present embodiment, the thickness $H_{130a}$ of the first portion 130a of the nitride 130 is about 2.3 micron and the thickness $H_{130b}$ of the second portion 130b of the nitride 130 is about 1.4 micron. However, the present embodiment is not limited by the thickness of the nitride described herein.

It should be noticed that, since the method of the present embodiment can be followed by the method for forming the light-emitting diode (LED) device. That is, the light-emitting layer, the semiconductor layer and the plurality of electrodes are sequentially formed on, for example, the side of the nitride 130 away from the silicon substrate 110. Of course, except for the aforementioned light-emitting diode, the device formed by the method of the present embodiment can be used to form the electronic device with high power such as the field effect transistor (FET) or high electron mobility transistor (HEMT).

In order to clearly describe the method for forming the nitride on the silicon substrate of the present embodiment which utilizes the multi-level temperature modulation process to form the buffer layer so as to improve the effect of the thermal stress on the quality of the later formed epitaxy, Table 1 listed below illustrates the details.

Table 1 shows the comparisons between different embodiments under different numbers of the temperature levels of the multi-level temperature modulation process. From embodiment D1 to the embodiment D4, the buffer layers made of aluminum nitride are all formed on the silicon substrates respectively, wherein the thickness of each buffer layer shown in Table 1 is about 100~300 nm. Moreover, after the buffer layer is formed, the first portion of the gallium nitride with a thickness of about 2.3 micron is formed in advance. Thereafter, the insertion layer (three-layer superlattice layer structure) with a thickness of about 0.2 micron is formed. Then, the second portion of the gallium nitride with a thickness of about 1.4 micron is formed. In the embodiment D1 through the embodiment D4, the total thickness of the gallium nitride is about 3.7 micron. In theses embodiments, the nitrides are formed on the (111) surface of the silicon substrate. However, the present invention is not limited to by the kind of the silicon substrate. Furthermore, taking embodiment D3 as an exemplar, the multi-level temperature modulation process applied in the embodiment D3 includes five temperature levels and four temperature modulations. In addition, each temperature modulation is 50 centigrade and the process temperature at each temperature level of the multi-level temperature modulation process remains unchanged until the thickness increasing amount of the buffer layer is about 35 nanometers.

TABLE 1

| | sample | | | |
|---|---|---|---|---|
| | D1 | D2 | D3 | D4 |
| Number of temperature levels of the multi-level temperature modulation process | 1 | 3 | 5 | 7 |
| Each temperature level of the multi-level temperature modulation process (° C.) | 1000 | 1000-><br>900-><br>800 | 1000-><br>950-><br>900-><br>850-><br>800 | 1000-><br>950-><br>900-><br>850-><br>800-><br>750-><br>700 |
| The thickness of the buffer layer (nm) | 210 | 70 +<br>50 * 2 | 70 +<br>35 * 4 | 70 +<br>35 * 6 |
| The total thickness of the first type semiconductor (μm) | 3.7 | 3.7 | 3.7 | 3.7 |
| Raman shift (cm$^{-1}$) | 561.9 | 562.6 | 563.9 | 565.3 |
| Δω (cm$^{-1}$) | −6.1 | −5.4 | −4.1 | −2.7 |
| Remaining stress (GPa) | −1.42 | −1.26 | −0.95 | −0.63 |
| Photoluminescence spectral peak energy at low temperature (eV) | 3.460 | 3.461 | 3.462 | 3.469 |

The embodiment D1 differs from the embodiment D2 through embodiment D4 on that the buffer layer in the embodiment D1 is formed on the silicon substrate at a temperature of 1000 centigrade and, in the embodiment D2 through embodiment D4, the number of temperature levels of the multi-level temperature modulation process is larger than 1. Specifically, as for the embodiment D2, the embodiment D3 and the embodiment D4, the numbers of temperature levels of the multi-level temperature modulation process are 3, 5 and 7 respectively. For instance, in the embodiment D2, the buffer layer is formed at the temperature progressively dropped from 1000 centigrade to 900 centigrade and then dropped to 800 centigrade and there are three temperature levels of the multi-level temperature modulation process.

Figure 2:
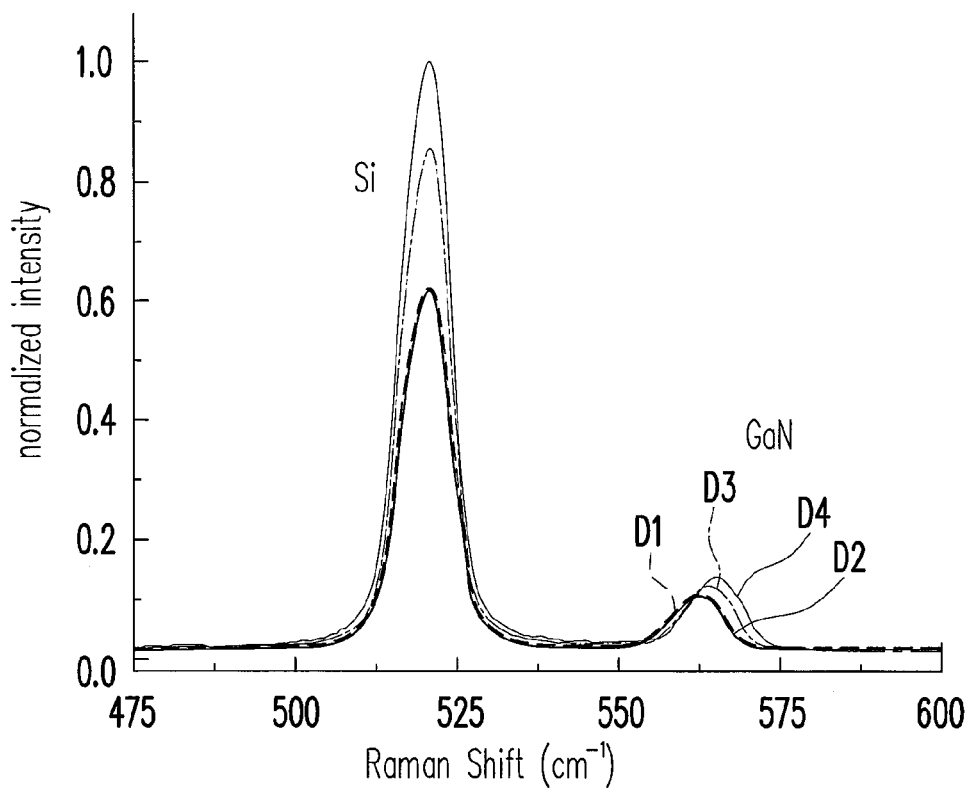
FIG. 2 is a curve diagram showing a Raman scattering spectrum of a nitride under different numbers of the temperature levels of the multi-level temperature modulation process according to one embodiment of the present invention.
Figure 3:
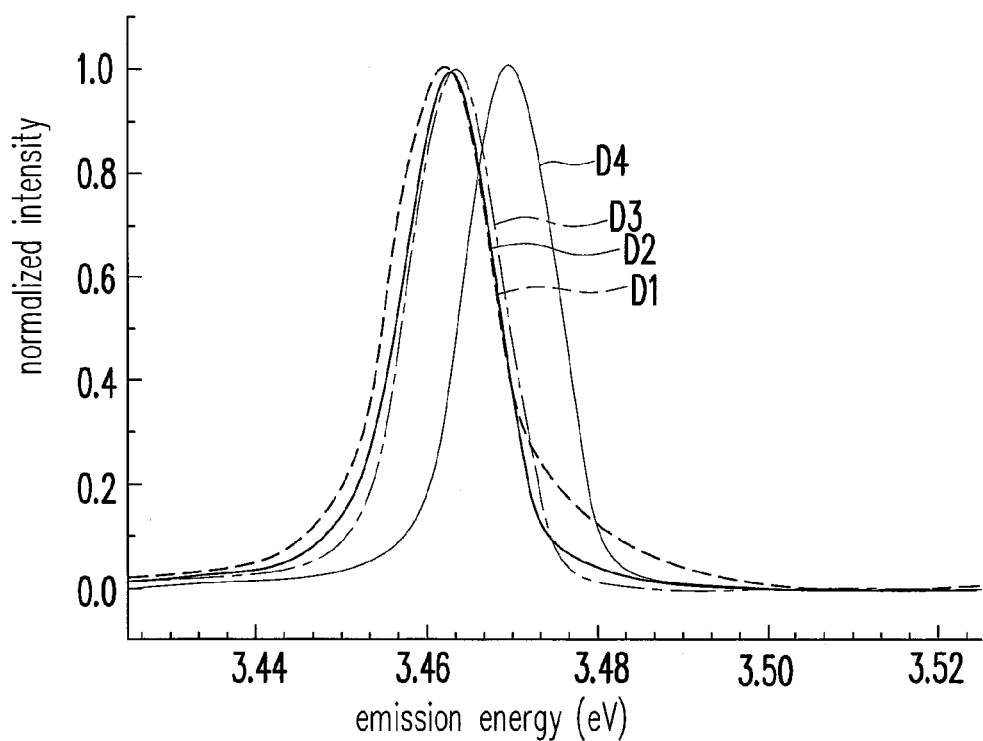
FIG. 3 is a curve diagram showing a photoluminescence spectrum of a nitride under different numbers of the temperature levels of the multi-level temperature modulation process according to one embodiment of the present invention.
Figure 4:
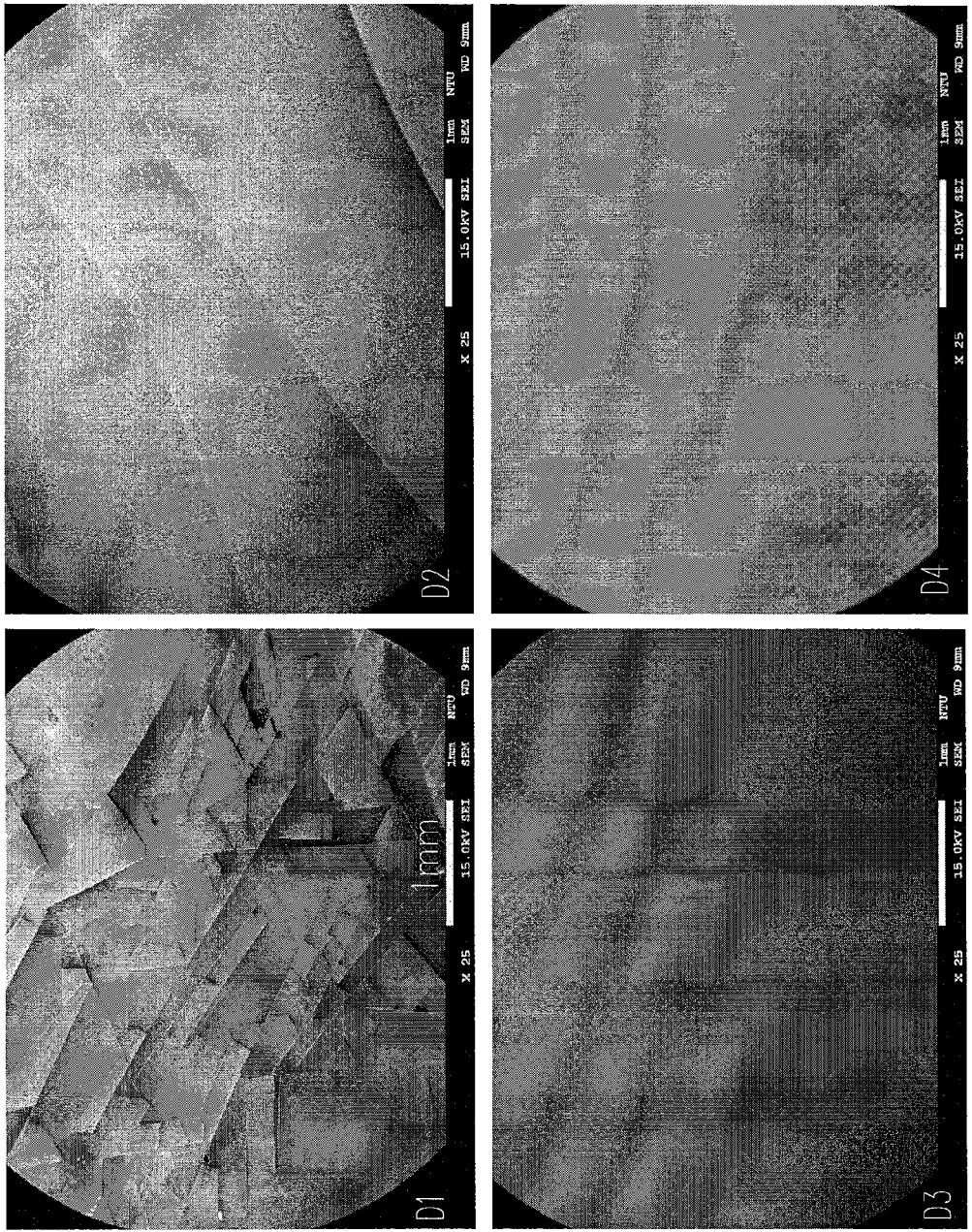
FIG. 4 is a surface image of a nitride observed by Scanning Electron Microscopy under different numbers of the temperature levels of the multi-level temperature modulation process according to one embodiment of the present invention.

The following description accompanying FIGS. 2 through 4 is used to further clearly describe the buffer layer formed by multi-level temperature modulation process and benefiting the improvement of the epitaxial quality of the nitride.

FIG. 2 is a curve diagram showing a Raman scattering spectrum of a nitride under different numbers of temperature levels of the multi-level temperature modulation process according to one embodiment of the present invention. As shown in FIG. 2, as the Raman shift around 550~575 cm$^{-1}$, the stress of the gallium nitride can be observed. Generally, under no stress situation, the peak of the Raman shift of the gallium nitride is at 568 cm$^{-1}$. However, due to thermal expansion coefficient difference between the gallium nitride and the silicon substrate, the tensile stress is generated within the gallium nitride during the temperature dropping process after the gallium nitride film is formed. Hence, in the present embodiment, by using the buffer layer formed by the multi-level temperature modulation process and the insertion layer, the compressive stress for compensating the tensile stress is provided. Thus, the negative effect on the quality of the epitaxy of the gallium nitride due to the tensile stress herein can be alleviated.

As shown in the sixth row in Table 1, when the number of the temperature levels of the multi-level temperature modulation process is increased, the peak of the Raman shift is shifted towards to 568 cm$^{-1}$. Each of the values Δ ω shown in the seventh row in Table 1 is the difference between the peak and 568 cm$^{-1}$ and the minus sign represents the tensile stress. From the seventh row of Table 1, it can be noticed that when the number of the temperature levels of the multi-level temperature modulation process increases, the magnitudes of the values Δ ω decreases. In other words, the compressive stress provided by the buffer layer can be gradually evenly matched with the tensile stress generated within the gallium nitride after the temperature is dropped. Also, as shown in the eighth row of Table 1, the remaining stress between the gallium nitride and the silicon substrate is gradually decreased with the increasing of the number of the temperature levels of the multi-level temperature modulation process, wherein the minus sign represents the tensile stress. That is, by properly adjust the number of the temperature levels of the multi-level temperature modulation process, the buffer layer structure of the present embodiment can effectively decrease the stress remaining within the gallium nitride.

FIG. 3 is a curve diagram showing a photoluminescence spectrum of a nitride under different numbers of temperature levels of the multi-level temperature modulation process according to one embodiment of the present invention. As shown in FIG. 3, when the number of the temperature levels of the multi-level temperature modulation process is increased, the blueshift phenomenon happens. That is, when the number of the temperature levels of the multi-level temperature modulation process is increased, the band gap of the electronic transition is increased accordingly, which means the stress within the gallium nitride is changed with a tendency towards compressive stress. As shown in the last row of Table 1, when the temperature is low (such as 10K), the energy of the peak of the photoluminescence is increased with the increasing of the number of the temperature levels of the multi-level temperature modulation process. In other words, the number of the temperature levels of the multi-level temperature modulation process is increased, the compressive stress is intensive enough for being evenly matched with the tensile stress generated while the temperature is dropped.

FIG. 4 is a surface image of a nitride observed by Scanning Electron Microscopy under different numbers of the temperature levels of the multi-level temperature modulation process according to one embodiment of the present invention. As shown in FIG. 4, with the increasing of the number of the temperature levels of the multi-level temperature modulation process, the crack-free gallium nitride structure can be manufactured according to the embodiment of the present invention (as shown in embodiment D4).

Altogether, in the embodiment of the present invention, the method for forming the nitride on the silicon substrate utilizes the buffer layer formed by the multi-level temperature modulation process with progressively dropping the temperature to provide a compressive stress for compensating the tensile stress generated within the nitride during the temperature dropping process after the nitride is formed. Thus, by comparing with the conventional buffer layer formed by the modulating ternary element components, the buffer layer of the present embodiment is formed from binary element components by the method with a relatively simple process steps and the thickness of the buffer layer of the present invention is smaller than 1 micron. Further, in the embodiment of the present invention, the method for forming nitride on the silicon substrate can utilize an insertion layer to further provide the compressive stress to contend with the tensile stress so as to produce a crack-free nitride structure.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for forming nitride on a silicon substrate, comprising:
    providing a silicon substrate;
    forming a buffer layer on the silicon substrate by a multi-level temperature modulation having a plurality of temperature modulations and a plurality of temperature levels, wherein each temperature modulation comprises decreasing a process temperature, the process temperature ramps down from one temperature level to another in each temperature modulation and the process temperature at each temperature level remains unchanged until a thickness increasing amount of the buffer layer at the corresponding temperature level reaches a predetermined thickness, wherein the temperature levels successively decrease, there are n temperature levels, the process temperature at each i temperature level is lower than the process temperature at each corresponding i−1 temperature level, and $1 < i \leq n$; and
    forming a nitride on the buffer layer.

2. The method of claim 1, wherein the multi-level temperature modulation has a plurality of temperature levels and each of the temperature levels is in the range of 600~1200 centigrade.

3. The method of claim 1, wherein a thickness of the buffer layer is in the range of 100~1000 nm.

4. The method of claim 1, wherein the buffer layer is made of aluminum nitride.

5. The method of claim 1, wherein the step of forming the nitride comprises forming a first portion of the nitride, forming a second portion of the nitride on the first portion of the nitride and the step of forming the nitride on the silicon substrate further comprises:
    after the first portion of the nitride is formed and before the second portion of the nitride is formed, forming an insertion layer on the first portion of the nitride.

6. The method of claim 5, wherein the insertion layer comprises at least a superlattice layer structure.

7. The method of claim 6, wherein the superlattice layer structure comprises an aluminum nitride layer and a gallium nitride layer.

8. A method for forming nitride on a silicon substrate, comprising:
    providing a silicon substrate;
    forming a buffer layer on the silicon substrate by a multi-level temperature modulation having a plurality of temperature modulations and a plurality of temperature levels, wherein each temperature modulation comprises decreasing a process temperature, the process temperature ramps down from one temperature level to another in each temperature modulation and the process temperature at each temperature level remains unchanged until a thickness increasing amount of the buffer layer at the corresponding temperature level reaches a predetermined thickness, wherein the temperature levels successively decrease, there are n temperature levels, the process temperature at each i temperature level is lower than the process temperature at each corresponding i−1 temperature level, and $1 < i \leq n$, and the buffer layer is made of only one type of binary compound; and
    forming a nitride on the buffer layer.

9. The method of claim 8, wherein the buffer layer is made of aluminum nitride.

* * * * *